United States Patent
Badawy et al.

(10) Patent No.: US 10,234,354 B2
(45) Date of Patent: Mar. 19, 2019

(54) LEAK DETECTION

(71) Applicant: Intelliview Technologies Inc., Calgary (CA)

(72) Inventors: Wael Badawy, Calgary (CA); Ashiq Rahman, Calgary (CA); Shane Rogers, Calgary (CA); Shan Du, Calgary (CA)

(73) Assignee: Intelliview Technologies Inc., Calgary (CA)

( * ) Notice: Subject to any disclaimer, the term of this patent is extended or adjusted under 35 U.S.C. 154(b) by 33 days.

(21) Appl. No.: 14/243,648

(22) Filed: Apr. 2, 2014

(65) Prior Publication Data

US 2015/0317787 A1  Nov. 5, 2015

(30) Foreign Application Priority Data

Mar. 28, 2014  (CA) .................................... 2847707

(51) Int. Cl.
*G01R 1/16* (2006.01)
*G01M 3/04* (2006.01)
(Continued)

(52) U.S. Cl.
CPC ................ *G01M 3/04* (2013.01); *G01M 3/38* (2013.01); *G01R 33/3802* (2013.01); *G01R 33/3804* (2013.01); *G01R 33/3806* (2013.01); *G01R 33/3808* (2013.01); *G06T 7/001* (2013.01); *G06T 7/0008* (2013.01); *G06T 7/90* (2017.01);
(Continued)

(58) Field of Classification Search
CPC .................... B41M 3/10; G06T 1/0021; G06T 2207/10024; G06T 2207/20104; G01N 27/626; G01V 3/02; G01V 3/04; G01V 3/06; G01V 3/08; D06F 77/005; G01R 33/3802; G01R 33/3804; G01R 33/3806; G01R 33/3808; G01R 5/04; G01R 5/06;
(Continued)

(56) References Cited

U.S. PATENT DOCUMENTS 2,915,975 A  12/1959  Kittrell et al.
3,180,134 A   4/1965  Wadlington
(Continued)

FOREIGN PATENT DOCUMENTS

CA  1 242 506 A  9/1988
CA  1 255 795 A  6/1989
(Continued)

OTHER PUBLICATIONS

JP 2013202574 Machine Translation, May 23, 2013.*
(Continued)

*Primary Examiner* — Giovanni Astacio-Oquendo
*Assistant Examiner* — Raul Rios Russo
(74) *Attorney, Agent, or Firm* — Christensen O'Connor Johnson Kindness PLLC

(57) ABSTRACT

Apparatus and corresponding method are invented for detecting a leak in equipment forming a target, such as a stuffing box. The apparatus includes an image analyzer configured to receive an image from camera and analyze the image to determine if a leak on the equipment is present by comparing a color channel of the image with a reference and the image analyzer having an output port for delivering a notification upon the image analyzer determining that a leak is present on the equipment.

16 Claims, 4 Drawing Sheets

(51) Int. Cl.
*G06T 7/00* (2017.01)
*G01R 33/38* (2006.01)
*G01M 3/38* (2006.01)
*G06T 7/90* (2017.01)

(52) U.S. Cl.
CPC .............. *G06T 2207/10024* (2013.01); *G06T 2207/20104* (2013.01); *G06T 2207/30164* (2013.01)

(58) Field of Classification Search
CPC .......... G01R 5/16; H02K 16/00; H02K 19/00; H02K 21/00
USPC .... 324/71.4, 76.11, 105, 142, 207.14, 244.1, 324/323, 329, 330, 345, 348, 354, 468; 382/100, 141, 152
See application file for complete search history.

(56) References Cited

U.S. PATENT DOCUMENTS

| | | |
|---|---|---|
| 3,276,246 A | 10/1966 | Truman et al. |
| 3,958,607 A | 5/1976 | Gray |
| 3,967,678 A | 7/1976 | Blackwell |
| 4,023,201 A | 5/1977 | Faulkner |
| 4,045,671 A | 8/1977 | Dille et al. |
| 4,107,738 A | 8/1978 | Van Norman |
| 4,146,799 A | 3/1979 | Pitt et al. |
| 4,181,845 A | 1/1980 | Bolton |
| 4,246,604 A | 1/1981 | Hundertmark et al. |
| 4,249,810 A | 2/1981 | O'Connor et al. |
| 4,372,658 A | 2/1983 | O'Connor et al. |
| 4,434,427 A | 2/1984 | Clarke et al. |
| 4,495,417 A | 1/1985 | Hohensang |
| 4,517,458 A | 5/1985 | Barringer |
| 4,542,973 A | 9/1985 | Johnson et al. |
| 4,560,931 A | 12/1985 | Murakami et al. |
| 4,607,925 A | 8/1986 | Kamigaichi et al. |
| 4,612,797 A | 9/1986 | Barkhoudarian |
| 4,655,607 A | 4/1987 | Kern et al. |
| 4,656,509 A | 4/1987 | Matsuyama et al. |
| 4,677,472 A | 6/1987 | Wood |
| 4,734,766 A | 3/1988 | Shiozumi et al. |
| 4,772,789 A | 9/1988 | Maram et al. |
| 4,841,149 A | 6/1989 | Martin et al. |
| 4,872,762 A | 10/1989 | Koshihara et al. |
| 4,886,370 A | 12/1989 | Koshihara et al. |
| 4,913,558 A | 4/1990 | Wettervik et al. |
| 4,933,678 A | 6/1990 | Tennyson |
| 4,963,742 A | 10/1990 | Abernathy |
| 4,983,836 A | 1/1991 | Matoba et al. |
| 4,988,210 A | 1/1991 | Koshihara et al. |
| 4,991,006 A | 2/1991 | Wood |
| 5,001,346 A | 3/1991 | Barkhoudarian |
| 5,084,764 A | 1/1992 | Day |
| 5,090,259 A | 2/1992 | Shishido et al. |
| 5,148,699 A | 9/1992 | Morse |
| 5,175,964 A | 1/1993 | Girndt |
| 5,195,392 A | 3/1993 | Moore et al. |
| 5,210,526 A | 5/1993 | Imperiali |
| 5,245,860 A | 9/1993 | Chang et al. |
| 5,280,530 A | 1/1994 | Trew et al. |
| 5,281,826 A | 1/1994 | Ivancic et al. |
| 5,287,133 A | 2/1994 | Bohley |
| 5,295,201 A | 3/1994 | Yokohama |
| 5,329,368 A | 7/1994 | Plotke |
| 5,329,824 A | 7/1994 | Carapezza et al. |
| 5,333,501 A | 8/1994 | Okada et al. |
| 5,394,939 A | 3/1995 | Walker |
| 5,430,293 A | 7/1995 | Sato et al. |
| 5,457,288 A | 10/1995 | Olsson |
| 5,461,236 A | 10/1995 | Gram et al. |
| 5,467,640 A | 11/1995 | Salinas et al. |
| 5,501,115 A | 3/1996 | Kamiyama et al. |
| 5,517,427 A | 5/1996 | Joyce |
| 5,523,569 A | 6/1996 | Hornfeld et al. |
| 5,527,169 A | 6/1996 | Goldenberg et al. |
| 5,537,045 A | 7/1996 | Henderson |
| 5,537,336 A | 7/1996 | Joyce |
| 5,557,277 A | 9/1996 | Tricoles et al. |
| 5,592,228 A | 1/1997 | Dachiku et al. |
| 5,592,286 A | 1/1997 | Fedor |
| 5,615,007 A | 3/1997 | Matsuura et al. |
| 5,616,854 A | 4/1997 | Berg |
| 5,617,482 A | 4/1997 | Brusewitz |
| 5,654,771 A | 8/1997 | Tekalp et al. |
| 5,672,874 A | 9/1997 | Fujii et al. |
| 5,708,193 A | 1/1998 | Ledeen et al. |
| 5,734,167 A | 3/1998 | Skelly |
| 5,850,285 A | 12/1998 | Hill, Jr. et al. |
| 5,874,988 A * | 2/1999 | Gu .......................... H04N 9/74 348/97 |
| 5,889,199 A | 3/1999 | Wong et al. |
| 5,939,717 A | 8/1999 | Mullins |
| 5,974,860 A | 11/1999 | Kuroda et al. |
| 5,982,909 A | 11/1999 | Erdem et al. |
| 6,020,918 A | 2/2000 | Murphy |
| 6,049,281 A | 4/2000 | Osterweil |
| 6,130,707 A | 10/2000 | Koller et al. |
| 6,157,033 A | 12/2000 | Chudnovsky |
| 6,243,483 B1 | 6/2001 | Petrou et al. |
| 6,312,226 B1 | 11/2001 | Senior, Jr. et al. |
| 6,314,137 B1 | 11/2001 | Ono et al. |
| 6,359,645 B1 | 3/2002 | Sivacoe |
| 6,362,488 B1 | 3/2002 | Cabrera et al. |
| 6,473,169 B1 | 10/2002 | Dawley et al. |
| 6,493,041 B1 | 12/2002 | Hanko et al. |
| 6,514,346 B1 | 2/2003 | Nichols |
| 6,515,799 B2 | 2/2003 | Ishijima et al. |
| 6,525,333 B1 | 2/2003 | Hooker et al. |
| 6,535,639 B1 | 3/2003 | Uchihachi et al. |
| 6,539,106 B1 | 3/2003 | Gallarda et al. |
| 6,549,643 B1 | 4/2003 | Toklu et al. |
| 6,550,499 B1 | 4/2003 | Pai |
| 6,553,140 B1 | 4/2003 | Soupliotis et al. |
| 6,577,333 B2 | 6/2003 | Tai et al. |
| 6,580,385 B1 | 6/2003 | Winner et al. |
| 6,621,516 B1 | 9/2003 | Wasson et al. |
| 6,628,805 B1 | 9/2003 | Hansen et al. |
| 6,628,831 B1 | 9/2003 | Needham |
| 6,628,835 B1 | 9/2003 | Brill et al. |
| 6,646,676 B1 | 11/2003 | DaGraca et al. |
| 6,650,704 B1 | 11/2003 | Carlson et al. |
| 6,654,481 B2 | 11/2003 | Amemiya et al. |
| 6,665,074 B2 | 12/2003 | Huang |
| 6,680,778 B2 | 1/2004 | Hinnrichs et al. |
| 6,697,523 B1 | 2/2004 | Divakaran et al. |
| 6,727,818 B1 | 4/2004 | Wildman et al. |
| 6,768,115 B2 | 7/2004 | Mikula et al. |
| 6,771,268 B1 | 8/2004 | Crinon |
| 6,791,088 B1 | 9/2004 | Williams et al. |
| 6,812,846 B2 | 11/2004 | Gutta et al. |
| 6,820,653 B1 | 11/2004 | Schempf et al. |
| 6,859,285 B1 | 2/2005 | Chang |
| 6,866,089 B2 | 3/2005 | Avila |
| 6,870,573 B2 | 3/2005 | Yeo et al. |
| 6,900,439 B2 | 5/2005 | Komiyama et al. |
| 6,931,149 B2 | 8/2005 | Hagene et al. |
| 6,948,258 B2 | 9/2005 | Coulombe et al. |
| 6,958,683 B2 | 10/2005 | Mills et al. |
| 6,965,430 B2 | 11/2005 | Kvassheim |
| 7,009,695 B2 | 3/2006 | Some et al. |
| 7,016,540 B1 | 3/2006 | Gong et al. |
| 7,022,993 B1 | 4/2006 | Williams, II et al. |
| 7,043,964 B1 | 5/2006 | Hickman et al. |
| 7,046,761 B2 | 5/2006 | Ellenbogen et al. |
| 7,062,012 B1 | 6/2006 | Chng et al. |
| 7,110,458 B2 | 9/2006 | Divakaran et al. |
| 7,127,120 B2 | 10/2006 | Hua et al. |
| 7,131,344 B2 | 11/2006 | Tarumi |
| 7,143,352 B2 | 11/2006 | Divakaran et al. |
| 7,151,852 B2 | 12/2006 | Gong et al. |
| 7,154,102 B2 | 12/2006 | Poteet et al. |
| 7,164,476 B2 | 1/2007 | Shima et al. |

(56) References Cited

U.S. PATENT DOCUMENTS

| | | |
|---|---|---|
| 7,189,970 B2 | 3/2007 | Racca et al. |
| 7,214,925 B2 | 5/2007 | Wagoner et al. |
| 7,289,918 B2 | 10/2007 | Nagase |
| 7,298,869 B1 | 11/2007 | Abernathy |
| 7,345,757 B2 | 3/2008 | Penza |
| 7,358,860 B2 | 4/2008 | Germouni et al. |
| 7,359,931 B2 | 4/2008 | Tarabzouni et al. |
| 7,375,814 B2 | 5/2008 | Reichardt et al. |
| 7,381,972 B1 | 6/2008 | Varmette et al. |
| 7,382,895 B2 | 6/2008 | Bramblet et al. |
| 7,385,681 B2 | 6/2008 | Ninomiya et al. |
| 7,421,461 B2 | 9/2008 | Prokop et al. |
| 7,460,980 B2 | 12/2008 | Hinn |
| 7,468,520 B1 | 12/2008 | Varmette et al. |
| 7,486,399 B1 | 2/2009 | Reichardt et al. |
| 7,505,063 B1 | 3/2009 | Bastedo et al. |
| 7,616,782 B2 | 11/2009 | Badawy |
| 7,618,603 B2 | 11/2009 | Seames et al. |
| 7,639,840 B2 | 12/2009 | Hanna et al. |
| 7,645,992 B2 | 1/2010 | Lyubchik et al. |
| 7,649,174 B2 | 1/2010 | Mammen et al. |
| 7,665,346 B1 | 2/2010 | Stauffer et al. |
| 7,669,614 B2 | 3/2010 | Cohen |
| 7,675,029 B2 | 3/2010 | Ramstad et al. |
| 7,888,941 B2 | 2/2011 | San Martin et al. |
| 7,896,073 B2 | 3/2011 | Forgang et al. |
| 7,916,170 B2 | 3/2011 | Soltysik et al. |
| 7,918,126 B2 | 4/2011 | McStay et al. |
| 7,939,804 B2 | 5/2011 | Schmidt |
| 7,940,297 B2 | 5/2011 | Penza et al. |
| 7,961,906 B2 | 6/2011 | Ruedin |
| 7,969,470 B2 | 6/2011 | Kishida |
| 8,004,415 B2 | 8/2011 | Boss et al. |
| 8,124,931 B2 | 2/2012 | Andrews et al. |
| 8,150,201 B2 | 4/2012 | Kasai et al. |
| 8,254,625 B2 | 8/2012 | Coulter et al. |
| 8,260,052 B1 | 9/2012 | Scannell et al. |
| 9,020,261 B2 | 4/2015 | Lipton et al. |
| 9,021,006 B2 | 4/2015 | Myers et al. |
| 9,158,975 B2 | 10/2015 | Lipton et al. |
| 9,165,190 B2 | 10/2015 | Zhang et al. |
| 9,195,883 B2 | 11/2015 | Brewer et al. |
| 9,204,107 B2 | 12/2015 | Yin et al. |
| 9,219,889 B2 | 12/2015 | Myers et al. |
| 9,240,051 B2 | 1/2016 | Liu et al. |
| 9,247,211 B2 | 1/2016 | Zhang et al. |
| 2002/0044054 A1 | 4/2002 | Krubiner et al. |
| 2002/0067259 A1 | 6/2002 | Fufidio et al. |
| 2002/0179300 A1 | 12/2002 | Gay et al. |
| 2003/0010345 A1 | 1/2003 | Koblasz et al. |
| 2003/0010918 A1 | 1/2003 | Komiyama et al. |
| 2003/0063006 A1 | 4/2003 | van Staden |
| 2003/0072004 A1 | 4/2003 | Huang |
| 2003/0076417 A1 | 4/2003 | Thomas et al. |
| 2003/0086091 A1 | 5/2003 | Hinnrichs et al. |
| 2003/0128125 A1 | 7/2003 | Burbank et al. |
| 2004/0003914 A1 | 1/2004 | Avila |
| 2004/0061781 A1 | 4/2004 | Fennell et al. |
| 2004/0078299 A1* | 4/2004 | Down-Logan ..... G06Q 30/0601 705/26.1 |
| 2004/0122602 A1 | 6/2004 | Nagase |
| 2004/0263852 A1 | 12/2004 | Degtiarev et al. |
| 2005/0058321 A1 | 3/2005 | Buehler |
| 2005/0126263 A1 | 6/2005 | Avila |
| 2005/0131646 A1 | 6/2005 | Camus |
| 2005/0156111 A1 | 7/2005 | Racca et al. |
| 2005/0160794 A1 | 7/2005 | Sonntag et al. |
| 2005/0190966 A1* | 9/2005 | Etienne-Cummings ..... H04N 9/045 382/165 |
| 2005/0259869 A1* | 11/2005 | Lohweg ..... G01J 3/46 382/162 |
| 2006/0091310 A1 | 5/2006 | Furry |
| 2006/0093212 A1* | 5/2006 | Steinberg ..... G06K 9/0061 382/167 |
| 2006/0115110 A1* | 6/2006 | Rodriguez ..... B41M 3/10 382/100 |
| 2006/0126785 A1 | 6/2006 | Chng et al. |
| 2006/0155194 A1 | 7/2006 | Marcotte et al. |
| 2006/0203248 A1 | 9/2006 | Reichardt et al. |
| 2006/0220888 A1 | 10/2006 | Germouni et al. |
| 2006/0238741 A1 | 10/2006 | Ninomiya et al. |
| 2006/0249683 A1* | 11/2006 | Goldberg ..... G01N 21/78 250/370.01 |
| 2007/0000310 A1 | 1/2007 | Yamartino et al. |
| 2007/0018104 A1 | 1/2007 | Parvin et al. |
| 2007/0033170 A1 | 2/2007 | Sull et al. |
| 2007/0040121 A1 | 2/2007 | Kalayeh |
| 2007/0196095 A1* | 8/2007 | Perala ..... G03B 15/03 396/155 |
| 2008/0069177 A1 | 3/2008 | Minor et al. |
| 2008/0092625 A1 | 4/2008 | Hinnrichs |
| 2008/0144885 A1 | 6/2008 | Zucherman et al. |
| 2008/0203332 A1 | 8/2008 | McStay et al. |
| 2008/0231719 A1 | 9/2008 | Benson et al. |
| 2008/0285840 A1* | 11/2008 | Kawai ..... G01N 21/8851 382/141 |
| 2009/0056949 A1 | 3/2009 | McStay et al. |
| 2009/0200466 A1 | 8/2009 | Mammen et al. |
| 2009/0313187 A1 | 12/2009 | Miller |
| 2010/0127173 A1 | 5/2010 | Schmidt |
| 2010/0158330 A1* | 6/2010 | Guissin ..... G06K 9/00369 382/128 |
| 2010/0177247 A1* | 7/2010 | Sekulovski ..... H05B 37/029 348/602 |
| 2010/0211333 A1 | 8/2010 | Pruet et al. |
| 2010/0284570 A1 | 11/2010 | Grimberg |
| 2011/0018996 A1 | 1/2011 | Mian et al. |
| 2011/0075923 A1* | 3/2011 | Imai ..... G06K 9/4652 382/167 |
| 2011/0075924 A1* | 3/2011 | Shrestha ..... H04N 1/6011 382/167 |
| 2011/0087444 A1 | 4/2011 | Volker |
| 2011/0101225 A1 | 5/2011 | Alawadi |
| 2011/0185790 A1 | 8/2011 | Choi et al. |
| 2011/0185791 A1 | 8/2011 | van Staden |
| 2011/0215936 A1 | 9/2011 | Ansari et al. |
| 2011/0267464 A1 | 11/2011 | Archer et al. |
| 2012/0045090 A1 | 2/2012 | Bobbitt et al. |
| 2012/0068851 A1* | 3/2012 | Jarrier ..... G01M 3/38 340/679 |
| 2012/0087573 A1 | 4/2012 | Sharma et al. |
| 2012/0150333 A1 | 6/2012 | De Luca et al. |
| 2012/0268594 A1 | 10/2012 | Haering et al. |
| 2012/0269430 A1 | 10/2012 | Deskevich et al. |
| 2012/0329170 A1* | 12/2012 | Matsumoto ..... G01N 21/78 436/164 |
| 2013/0066568 A1 | 3/2013 | Alonso |
| 2013/0279776 A1* | 10/2013 | Guissin ..... G06K 9/00369 382/128 |
| 2013/0335579 A1* | 12/2013 | Raghavan ..... G06K 9/00825 348/188 |
| 2014/0050355 A1 | 2/2014 | Cobb |
| 2014/0064553 A1* | 3/2014 | Knauth ..... G06K 9/00771 382/103 |
| 2014/0105480 A1* | 4/2014 | Motomura ..... G06T 7/0012 382/133 |
| 2014/0193065 A1 | 7/2014 | Chu et al. |
| 2014/0210984 A1 | 7/2014 | Warwick et al. |
| 2014/0278552 A1 | 9/2014 | Hold |
| 2014/0279733 A1 | 9/2014 | Djugash |
| 2014/0340502 A1 | 11/2014 | Freeman et al. |
| 2014/0368347 A1 | 12/2014 | White |
| 2015/0178949 A1* | 6/2015 | Ren ..... G09G 5/02 382/162 |
| 2015/0292976 A1 | 10/2015 | Xu et al. |
| 2015/0317787 A1 | 11/2015 | Badawy et al. |
| 2015/0379712 A1* | 12/2015 | Guissin ..... G06K 9/00369 382/128 |

(56) References Cited

U.S. PATENT DOCUMENTS

| | | | |
|---|---|---|---|
| 2017/0214820 A1* | 7/2017 | Davis | H04N 1/32149 |
| 2017/0290318 A1* | 10/2017 | Bergengren | A01M 1/08 |

FOREIGN PATENT DOCUMENTS

| | | | | |
|---|---|---|---|---|
| CA | 1306776 | C | 8/1992 | |
| CA | 1307839 | C | 9/1992 | |
| CA | 2117345 | A1 | 7/1993 | |
| CA | 2066578 | C | 12/1998 | |
| CA | 2176065 | C | 1/2000 | |
| CA | 2155136 | C | 12/2001 | |
| CA | 2416171 | A1 | 7/2004 | |
| CA | 2528299 | A1 | 1/2005 | |
| CA | 2509436 | A1 | 12/2006 | |
| CA | 2 277 713 | C | 10/2009 | |
| CA | 2 719 398 | A1 | 10/2009 | |
| CA | 2 437 496 | C | 8/2010 | |
| CA | 2 518 491 | C | 11/2011 | |
| CA | 2 670 571 | C | 5/2012 | |
| CA | 2 466 247 | A1 | 7/2013 | |
| CA | 2 826 115 | A1 | 3/2014 | |
| CN | 101846576 | A | 9/2010 | |
| CN | 101846576 | B | 12/2011 | |
| EP | 1486928 | A2 | 12/2004 | |
| JP | H11-326226 | A | 11/1999 | |
| JP | 2013-101474 | A | 5/2013 | |
| JP | 2013202574 | | * 5/2013 | G01M 3/38 |
| WO | 2005/087590 | A1 | 9/2005 | |

OTHER PUBLICATIONS

Garcia-Alegre, M.C., et al., "Color Index Analysis for Automatic Detection of Eggshell Defects," Proceeding of the SPIE 3966:380-387, Mar. 2000.

"IEEE UKSim 2014: UKSim-AMSS 16th International Conference on Modelling and Simulation," Cambridge University, Cambridge, U.K., Mar. 26-28, 2014, <http://uksim.info/uksim2014/uksim2014.htm#Papers> [retrieved Jul. 15, 2015], 18 pages.

Jadin, M.S., and K.H. Ghazali, "Gas Leakage Detection Using Thermal Imaging Technique," Proceedings of the 2014 UKSim-AMSS 16th International Conference on Computer Modelling and Simulation, Cambridge, U.K., Mar. 26-28, 2014, pp. 302-306.

Koschan, A., and M. Abidi, "Detection and Classification of Edges in Color Images: A Review of Vector-Valued Techniques," IEEE Signal Processing Magazine 22(1):64-73, Jan. 2005.

Saravanan, C., "Color Image to Grayscale Image Conversion," Proceedings of the 2010 Second International Conference on Computer Engineering and Applications (ICCEA), Bali Island, Indonesia, Mar. 19-21, 2010, vol. 2, pp. 196-199.

Wren, C., et al., "Pfinder: Real-Time Tracking of the Human Body," IEEE Transactions on Pattern Analysis and Machine Intelligence 19(7):780-785, Jul. 1997.

Zhou, P., et al., "Detection of Underground Petroleum Pipeline With Infrared Imaging Method," Acta Petrolei Sinica 27(5):127-130, 2006 [abstract].

Koschan, A., and M. Abidi, "Detection and Classification of Edges in Color Images," IEEE Signal Processing Magazine 22(1):64-73, Jan. 2005.

Saravanan, C., "Color Image to Grayscale Image Conversion," 2010 Second International Conference on Computer Engineering and Applications, Mar. 19, 2010, pp. 196-199.

"IEEE UKSim 2014: UKSim-AMSS 16th International Conference on Modelling and Simulation," Institute of Electrical and Electronics Engineers, Cambridge University, Cambridge, U.K., Mar. 26-28, 2014, <http://uksim.info/uksim2014/uksim2014.htm#Papers> [retrieved Jul. 15, 2015], 18 pages.

Amer, A., et al., "A Real-Time System for High-Level Video Representation: Application to Video Surveillance," Proceedings of SPIE—The International Society for Optical Engineering 5022(1):530-541, May 2003 (12 pages).

Badawy, W., and M. Bayoumi, "Algorithm-Based Low-Power VLSI Architecture for 2-D Mesh Video-Object Motion Tracking", IEEE Transactions on Circuits and Systems for Video Technology 12(4):227-237, Apr. 2002.

Badawy, W., and M. Bayoumi, "On Minimizing Hierarchical Mesh Coding Overhead: (HASM) Hierarchical Adaptive Structured Mesh Approach," Proceedings of the IEEE International Conference on Acoustics, Speech, and Signal Processing, Istanbul, Jun. 2000, vol. 4, pp. 1923-1926.

Badawy, W., and M.A. Bayoumi, "A Low Power VLSI Architecture for Mesh-Based Video Motion Tracking," IEEE Transactions on Circuits and Systems II: Analog and Digital Signal Processing 49(7):488-504, Jul. 2002.

Badawy, W., et al., "VLSI Architecture for Hierarchical Mesh Based Motion Estimation," 1999 IEEE Workshop on Signal Processing Systems: Design and Implementation, Taipei, Oct. 20-22, 1999 [abstract].

Badawy, W., "Low-Power Architectures for Video-Object Coding With Low Bit-Rate Applications," doctoral dissertation, University of Louisiana at Lafayette, Spring 2000, 139 pages [abstract].

Baykal, I.C., and G. A. Jullien, "Detection of Defects in Textures With Alignment Error for Real-Time Line-Scan Web Inspection Systems," IEEE Midwest Symposium on Circuits and Systems, Oklahoma State University, Stillwater, Okla., Aug. 4-7, 2002, pp. 292-295.

Baykal, I.C., et al., "On the Use of Hash Function for Defects Detection in Textures for In-Camera Web Inspection Systems," Proceedings of the IEEE International Symposium on Circuits and Systems, Scottsdale, Ariz., May 26-29, 2002, vol. 5, pp. 665-668.

Bevilacqua, A., and M. Roffilli, "Robust Denoising and Moving Shadows Detection in Traffic Scenes," Proceedings of the Computer Society Conference on Computer Vision and Pattern Recognition, Kauai, Hawaii, Dec. 9-14, 2001, pp. 1-4.

Birchfields, S., "An Elliptical Head Tracker," 31st Asilomar Conference on Signals, Systems and Computers, Pacific Grove, Calif., Nov. 2-5, 1997, 5 pages.

Birchfields, S., "Elliptical Head Tracking Using Intensity Gradients and Color Histograms," Proceedings of the IEEE Conference on Computer Vision and Pattern Recognition, Santa Barbara, Calif., Jun. 23-25, 1998, pp. 232-237.

Bobick, A.F., et al., "The KidsRoom: A Perceptually-Based Interactive and Immersive Story Environment," Technical Report 398, M.I.T Perceptual Computing, Nov. 1996, Revised Jun. 1998, 20 pages; also appears in Presence: Teleoperators and Virtual Environments 8(4):367-391, Aug. 1999.

Brofferio, S., and F. Rocca, "Interframe Redundancy Reduction of Video Signals Generated by Translating Objects," IEEE Transactions on Communications 25(4):448-455, Apr. 1977 [abstract].

Chaudhury, S., et al., "Heuristic Search Approach to Shape Matching in Image Sequences," IEEE Proceedings E-Computers and Digital Techniques 138(2):97-105, Mar. 1991 [abstract].

Chen, H., and H. Ye, "Oil Pipeline Leak Detection and Location Based on Image Processing," Journal of Tsinghua University (Science and Technology), 2005 [abstract].

Cheung, S.-C.S., and C. Kamath, "Robust Techniques for Background Subtraction in Urban Traffic Video," Proceedings of the SPIE 5308:881-892, Jan. 2004.

Cielniak, G., and T. Duckett, "People Recognition by Mobile Robots," Journal of Intelligent and Fuzzy Systems 15(1):21-27, 2004.

Dalal, N., et al., "Histograms of Oriented Gradients for Human Detection," Proceedings of the International Conference on Computer Vision and Pattern Recognition (CVPR '05), San Diego, Jun. 25, 2005, pp. 886-893.

Darrell, T., et al., "Integrated Person Tracking Using Stereo, Color, and Pattern Detection," Proceedings of the Conference on Computer Vision and Pattern Recognition, Santa Barbara, Calif., Jun. 23-25, 1998, pp. 601-609.

"Etherlynx: Track and Field Timing in the Digital Age," Lynx System Developers, Inc., Haverhill, Mass., at least as early as Mar. 17, 2016, <http://www.finishlynx.com>, 2 pages.

(56) References Cited

OTHER PUBLICATIONS

"Etherlynx2000," Datasheet, Lynx System Developers, Inc., Haverhill, Mass., at least as early as Mar. 17, 2016, <http://www.finishlynx.com>, 2 pages.
"FinishLynx Release Notes," Lynx System Developers, Inc., Haverhill, Mass., Nov. 27, 2006, <http://www.finishlynx.com>, 133 pages.
Fuentes, H.A., and O. Gonzalez, "Implementation of a 2D Real-Time Correlator Based on a DSP," Oct. 3, 2005, Texas Instruments Audio and Video/Imaging Series, <http://www.techonline.com/static/feature_articles/ti/paper_3.html> [retrieved Aug. 24, 2006], 7 pages.
García-Alegre, M.C., et al., "Color Index Analysis for Automatic Detection of Eggshell Defects," Proceedings of SPIE 3966:380-387, 2000.
Han, J., and B. Bhanu, "Detecting Moving Humans Using Color and Infrared Video," Proceedings of the IEEE Conference on Multisensor Fusion and Integration for Intelligent Systems, Tokyo, Jul. 30-Aug. 1, 2003, pp. 228-233.
Ivanov, Y., et al., "Tracking People in Mixed Modality Systems," Proceedings of SPIE 6508, Visual Communications and Image Processing 2007, San Jose, Jan. 28, 2008, 11 pages.
Jadin, M.S., and K.H. Ghazali, "Gas Leakage Detection Using Thermal Imaging Technique," 2014 UKSim-AMSS 16th International Conference on Computer Modelling and Simulation, Cambridge, U.K., Mar. 26-28, 2014, pp. 302-306.
Landabaso, J.-L., et al., "Shadow Removal With Morphological Reconstruction," Proceedings of Jornades de Recerca en Automàtica, Visió i Robòtica (AVR), Barcelona, 2004, 5 pages.
Lewis, J.P., "Fast Normalized Cross-Correlation," Vision Interface 10(1):120-123, 1995.
Li, B., and M.I. Sezan, "Event Detection and Summarization in Sports Video," Proceedings of the IEEE Workshop on Content-Based Access of Image and Video Libraries (CBAIVL '01), Dec. 14, 2001, pp. 132-138 [abstract].
Lipton, A., et al., "Moving Target Detection and Classification From Real-Time Video," Proceedings of the Fourth IEEE Workshop on Applications of Computer Vision (WACV '98), Princeton, N.J., Oct. 19-21, 1998, pp. 8-14 [abstract].
Lu, S., et al., "A Novel Video Summarization Framework for Document Preparation and Archival Applications," Proceedings of the 2005 IEEE Aerospace Conference, Big Sky, Mont., Mar. 5-12, 2005, pp. 1-10.
Manku, G.S., et al., "Object Tracking Using Affine Structure for Point Correspondences," Proceedings of the IEEE Conference on Computer Vision and Pattern Recognition, Puerto Rico, Jun. 17-19, 1997, 6 pages.
Ngo, C. et al., "Video Partitioning by Temporal Slice Coherency," IEEE Transactions on Circuits and Systems for Video Technology 11(8):941-953, Aug. 2001.
"Operator's Manual: FinishLynx 32," Lynx System Developers, Inc., Haverhill, Mass., Sep. 20, 2001, <http://www.finishlynx.com>, 202 pages.
Reid, I.D., and D.W. Murray, "Active Tracking of Foveated Feature Clusters Using Affine Structure," International Journal of Computer Vision 18:41-60, 1996.
Reid, I.D., and D.W. Murray, "Tracking Foveated Corner Clusters Using Affine Structure," Proceedings of the IEEE International Conference on Computer Vision, Berlin, May 11-14, 1993, pp. 76-83 [abstract].
Ruff, T., "Feasibility of Using Intelligent Video for Machine Safety Applications," Proceedings of the IEEE Industry Applications Society Annual Meeting (IAS '08), Edmonton, Alberta, Canada, Oct. 5-9, 2008, pp. 1-5.
Russell, D.M., "A Design Pattern-Based Video Summarization Technique: Moving From Low-Level Signals to High-Level Structure," Proceedings of the 33rd Annual Hawaii International Conference on System Sciences, Maui, Hawaii, Jan. 4-7, 2000, pp. 1-5.
Salvador, E., et al., "Cast Shadow Segmentation Using Invariant Color Features," Computer Vision and Image Understanding 95(2):238-259, Aug. 2004.
Shi, L., et al., "Texture Feature Application in Oil Spill Detection by Satellite Data," Congress on Image and Signal Processing (CISP '08), Sanya, China, May 27-30, 2008, pp. 784-788 [abstract].
Sidenbladh, H., "Detecting Human Motion With Support Vector Machines," Proceedings of the 17th IAPR International Conference on Pattern Recognition, Cambridge, U.K., Aug. 23-26, 2004, vol. 2, pp. 188-191.
Tian, Y., "S3-R1: The IBM Smart Surveillance System Release 1," Proceedings of the 14th Annual International Conference on Wireless and Optical Communications (WOCC 2005), Newark, N.J., Apr. 22-23, 2005 [abstract].
Tian, Y., et al., "Robust Salient Motion Detection With Complex Background for Real-time Video Surveillance," Motion and Video Computing 2:30-35, 2005.
Toklu, C., et al., "Tracking Motion and Intensity Variations Using Hierarchical 2-D Mesh Modeling for Synthetic Object Transfiguration," Graphical Models and Image Processing 58(6):553-573, Nov. 1996 [abstract].
Tuzel, O., et al., "Human Detection via Classification on Riemannian Manifolds," Proceedings of the IEEE Conference on Computer Vision and Pattern Recognition (CVPR '07), Minneapolis, Jun. 17-22, 2007, pp. 1-8.
Vilaplana, V., et al., "Region-Based Segmentation and Tracking of Human Faces," Proceedings of the 9th European Signal Processing Conference (EUSIPCO 1998), Rhodes, Sep. 8-11, 1998, pp. 311-314.
Wang, Y., and O. Lee, "Active Mesh—A Feature Seeking and Tracking Image Sequence Representation Scheme," IEEE Trans. on Image Processing, vol. 3, No. 5, pp. 610-624, 1994 [abstract].
Wang, Y., et al., "Use of Two-Dimensional Deformable Mesh Structures for Video Coding. II. The Analysis Problem and a Region-Based Coder Employing an Active Mesh Representation," IEEE Transactions on Circuits and Systems for Video Technology 6(6):647-659, Dec. 1996 [abstract].
Wei, Y., and W. Badawy, "A Novel Zoom Invariant Video Object Tracking Algorithm (ZIVOTA)," Proceedings of the 2003 IEEE Canadian Conference on Electrical and Computer Engineering (CCECE), Montréal, May 4-7, 2003, vol. 2, pp. 1191-1194 [abstract].
Extended European Search Report dated Jan. 2, 2017, issued in related European Application No. EP 14 79 1064, filed Apr. 29, 2014, 8 pages.

* cited by examiner

LEAK DETECTION

TECHNICAL FIELD

Leak detection.

BACKGROUND

Oil wells generally comprise a positive pressure pump located beneath the surface within the oil source. The pump is mechanically operated from the surface by a rod string operated by a walking beam apparatus. The rod string passes into the well at the surface of wellhead through a stuffing box, and the upper portion of the rod string is enclosed in a polished rod which provides a smooth surface to wear against the seals in the stuffing box. The reciprocating motion of the polished rod makes the oil flow up to the wellhead from where it is piped to storage. The stuffing box uses seals or packing to prevent leakage from passing out of the stuffing box from around the reciprocating rod. However, the harsh environment at the wellhead (corrosive chemicals, sand and abrasives, etc.) can cause the seals or packing in the stuffing box to deteriorate rapidly, thereby allowing oil to pass through the worn seals and be thrown about the immediate environment due to the reciprocating action of the rod. The Environmental Protection Agency has developed strict regulations against such occurrences and therefore it is important to provide sensors at the wellhead for recognizing stuffing box failure and for generating a signal to alert responsible operators to take appropriate action.

There are some existing apparatus to detect stuffing box leakage. Some methods surround the stuffing box by a reservoir of lubricant maintained at a static fluid pressure, which is substantially higher than the pressure at which the oil is produced from the well. A drop of the pressure in the reservoir indicates a leakage of the stuffing box. Some methods use container/salvage chamber to collect leaking oil. When the level of fluid in the container reaches a certain point, the leakage is detected. Existing methods require disruption of the oil well operation for their installation, and some even require modification to the stuffing box and/or wellhead piping and components. There is room for a new method and apparatus that is easy to install without interfering with wellhead operation.

SUMMARY

In an embodiment, there is provided a method of detecting a leak in equipment forming a target, the method comprising acquiring a test image of the target with a camera, in which the test image comprises pixel values that are representative of color, sending the test image to an image analyzer, analyzing the test image to determine if a leak is present on the equipment from the pixel values that are representative of color; and upon determining that a leak is present, generating a notification of the presence of a leak.

In an embodiment, there is provided an apparatus for detecting a leak in equipment forming a target, the apparatus comprising an image analyzer configured to receive an image from camera and analyze the image to determine if a leak on the equipment is present by comparing a color channel of the image with a reference and the image analyzer having an output port for delivering a notification upon the image analyzer determining that a leak is present on the equipment.

In an embodiment, there is provided an image analysis system comprising a camera and a server with an input port and an output port, the server being configured to carry out leak detection steps based on color information in a test image.

In various embodiments, there may be included any one or more of the following features: analyzing the test image comprises comparing a color channel of the test image with a reference; the reference comprises color information from a reference image of the target; the test image represents color in a first color space and analyzing the test image comprises transforming the first color space to a second color space; the second color space has a blue-yellow axis and a red-green axis; analyzing the test image comprises determining a dominant color channel of the test image; the presence of a leak is determined by the following protocol: the target is relatively dark when dominantly red or yellow or the target is relatively bright when dominantly green or blue; analyzing is carried out by analysis of a region of interest in the test image; analyzing comprises removing pixel values representative of glare from the test image; and the equipment is a stuffing box.

These and other aspects of the device and method are set out in the claims, which are incorporated here by reference.

BRIEF DESCRIPTION OF THE FIGURES

Embodiments will now be described with reference to the figures, in which like reference characters denote like elements, by way of example, and in which.

DETAILED DESCRIPTION

Immaterial modifications may be made to the embodiments described here without departing from what is covered by the claims.

Figure 1:
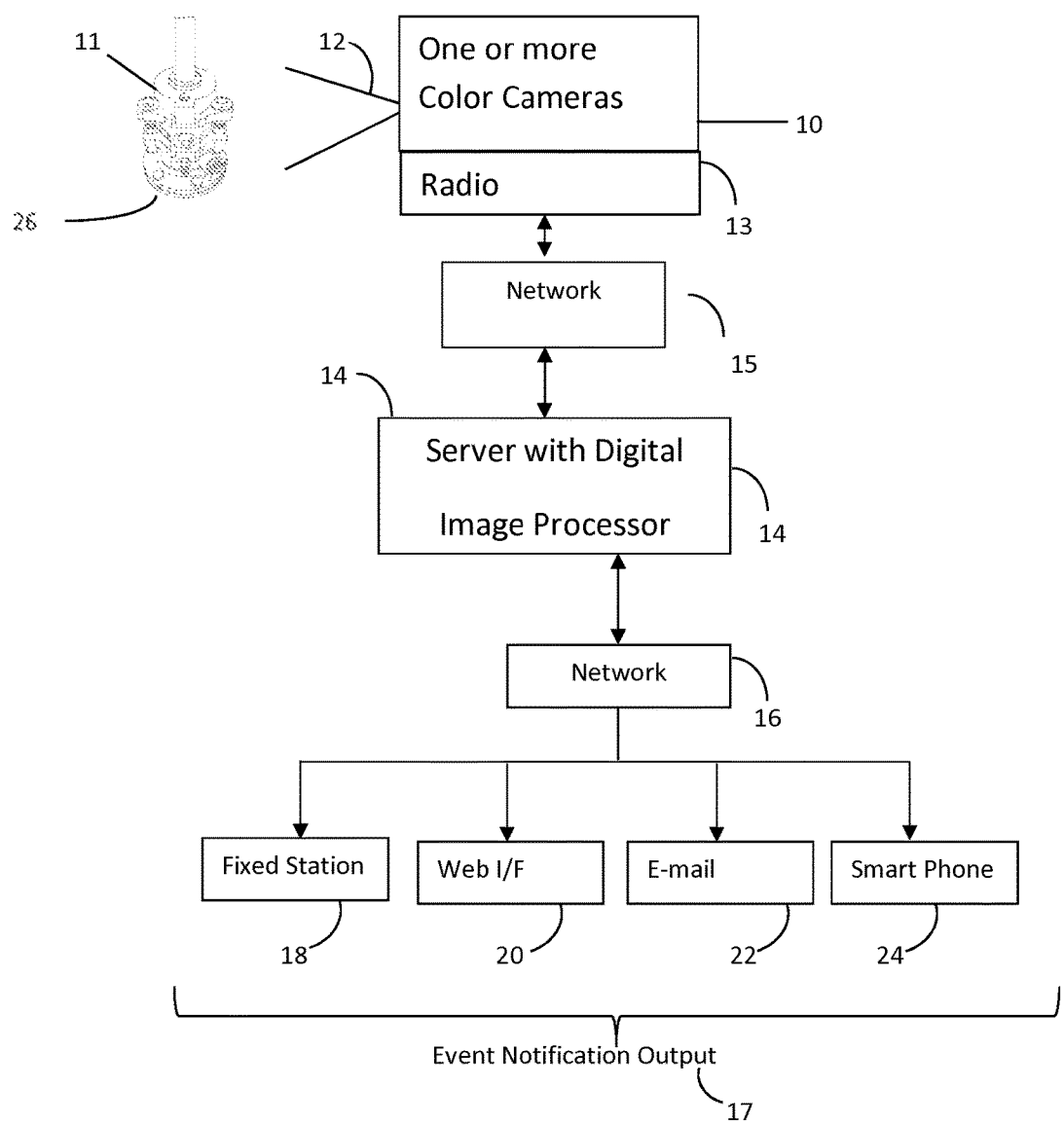
FIG. 1 is a schematic showing equipment for detecting a leak in equipment.
Figure 2:
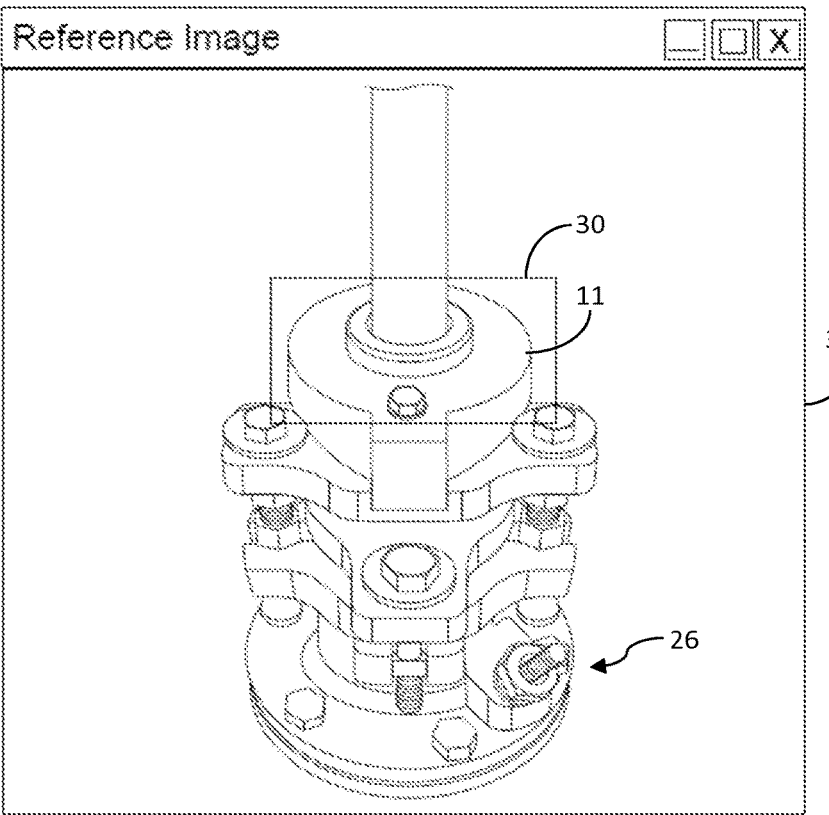
FIG. 2 is an exemplary reference image.

Referring to FIG. 1, an apparatus for leak detection is shown having one or more cameras 10 installed in the oil field facing a wellhead stuffing box 11. The camera 10 has a field of view 12 and the field of view will include the stuffing box 11. The camera 10 acquires an image of the stuffing box 11. In an initialization stage, the image is a reference image. In onsite operation, the camera 10 acquires a test image. The acquisition of the test image may occur on a schedule, for example at fixed intervals, such as daily or at shorter or longer intervals as the operator determines.

An image is a set of pixel values determined by light received in the camera 10 at locations on an imaging device in the camera corresponding to locations in the field of view. The images can be sent to a conventional input port of a server 14 directly via a conventional cable, or indirectly via a suitable communications channel such as a radio 13 that communications through a telecommunications network 15. In some embodiments, the server 14 may be formed of a local processor (for example, to carry out basic control of the camera) as well as a remote processor for carrying out other functions such as image analysis.

The server 14 analyzes the images and then determines if the stuffing box 11 has leaked or not. The server 14 functions as an image analyzer. The method and apparatus may be applied to other targets. A stuffing box is an example of a target. The server 14 may cause a notification 17 to be generated and output from an output port of the server 14, which may be any of a variety of notifications, and may be communicated directly to an operator or through a network 16, which may be the same network as network 15, via suitable methods such as through a fixed station 18, web interface 20, email 22, or smart phone 24. The output port may be for example a USB port, network interface, display driver or other conventional output port of a computer. The notification 17 may comprise an electronic message indicative of a leak, or the generation of a sound, light signal, mechanical signal or other signal that may be observed by a human or monitoring equipment. The server 14 may communicate two-way with a further remote server (not shown) or other remote device such as a smart phone 24. In on-demand operation, the remote device may instruct the server 14 to acquire a test image from the camera 10 and the test image 10 is then processed by the server 14. In some embodiments, the server 14 may be a remote server and need not be situated with the camera 10.

Figure 3:
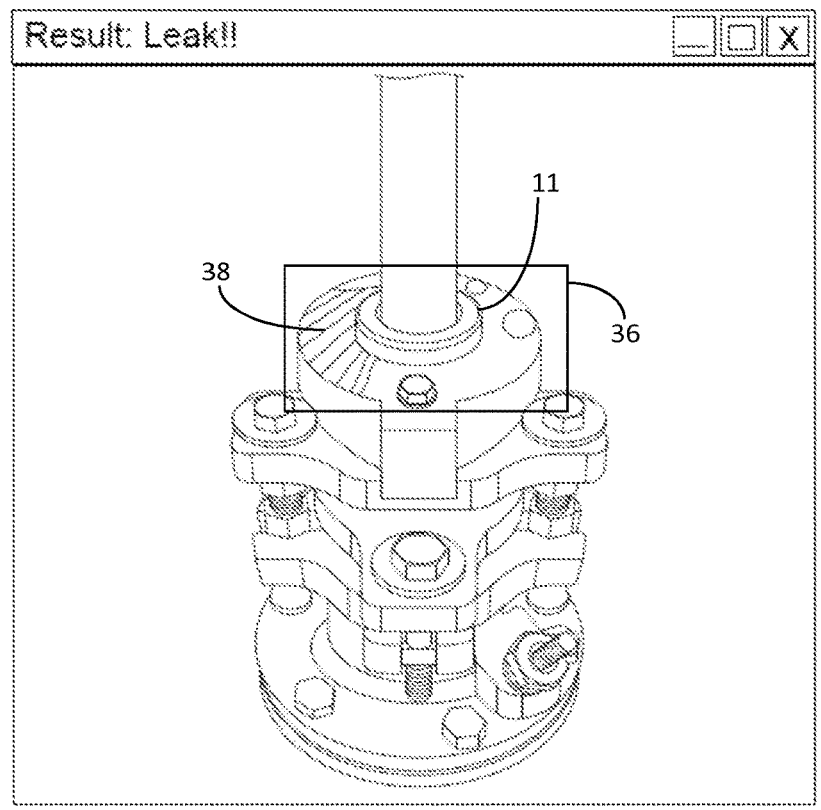
FIG. 3 is an exemplary test image.

For image analytics, color information is proposed to be used. Since the crude oil color is generally different from the stuffing box color, if there is a leakage, the top of the stuffing box will gather some black or dark brown oil as shown in FIG. 3.

A difficulty of this project is that many factors affect color appearance. The first thing is the lighting conditions. Since the stuffing box 11 is on a wellhead 26 and the wellhead 26 is in the field, the sunlight changes (e.g., cloudy, sunset, night, glare, shadow) affect the appearance of the captured images. As with any outdoor applications, weather condition is another big problem. For example, storm, snow, rain, and fog, also affects the image appearance. Occlusion, such as water drops on the stuffing box 11, dirt, rust, and snow gathered on the top of the stuffing box, is another challenge of the detection.

Figure 4:
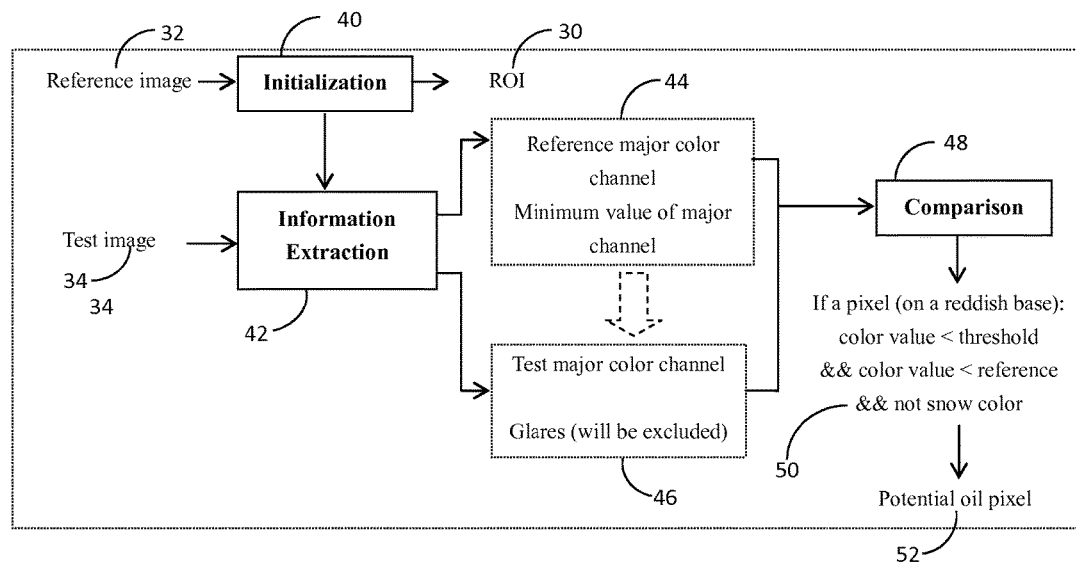
FIG. 4 illustrates processing steps carried out by the image analyzer.

Since the images are captured at various distance, direction and zoom level, the users may be required in an initialization step 40 (FIG. 4) to define a region of interest (ROI) 30 on the target stuffing box 11 by themselves. A software interface in the server 14 lets users draw a surrounding rectangle box around the ROI 30 on a reference image 32. The reference image 32 appears as for example a window on a display device associated with the server 14. Box selection of pixels from an image is a known process, as for example the snapshot function in Adobe™ Reader, and need not be further described. The ROI 30 is then processed. For one wellhead stuffing box, this initialization only needs one time since the camera 10 is fixed. For a testing image (FIG. 3), its ROI 36 is determined by the same position of the reference ROI 30.

Because of the color difference between the stuffing box 11 and the crude oil of a leak 38, color information is the major feature proposed in our approach. For determining a reference, we prefer to analyze a reference image 32 for color information that will correlate to color information in an ROI 36 of a test image. The reference image 32 is preferably an image of the same stuffing box 11 as is in the test image. However, in some embodiments, a reference image may be acquired from a representative stuffing box and used as a reference for test images from other stuffing boxes, if the environment is suitably stable. In other embodiments, the analyzer 14 may intelligently compare the test image with a reference or reference image, using more sophisticated statistical analysis than a greater than—less than analysis. For example, where a suite of reference images is available of one or more stuffing boxes, including the target stuffing box, and one or more test images of the target stuffing box are available, perhaps being separated in time by hours or days, statistical analyses such as Bayesian or neural network analysis may be applied to determine a probability of a leak.

There are many different color models to describe colors. A color model is an abstract mathematical model describing the way colors can be represented as tuples of numbers, typically as three or four values of color components. RGB model (Red, Green, and Blue) is the basic one that is associated with the original pixel values. Since the RGB values are very sensitive to the illumination changes, it is hard to use RGB color space to detect oil leak. We need to convert RGB to other color space in this situation. By investigating many color spaces, such as HSV, YCbCr, YUV, HSI, etc., we choose the CIE L*a*b* color space preferably, although other color spaces may be used.

A color space, for example CIE L*a*b* color space or the like, that encompass all colors the average human can see may be used. It is robust to image variations since even under bad environment we can still differentiate non-neutral colors (e.g., red, yellow, green). An L*a*b* color space is a color-opponent space with dimension L* for lightness and a* and b* for the color-opponent dimensions, based on nonlinearly compressed CIE XYZ color space coordinates. The vertical L* represents lightness ranging from 0-100. The horizontal axes are represented by a* and b*. They are at right angles to each other and cross each other in the center, which is neutral (gray, black or white). They are based on the principle that a color cannot be both red and green, or blue and yellow. The a* axis is green at one extremity (represented by −a), and red at the other (+a). The b* axis has blue at one end (−b) and yellow (+b) at the other. The center of each axis is 0. A value of 0, or very low numbers of both a* and b* will describe a neutral or near neutral. In theory there are no maximum values of a* and b*, but in practice they are usually numbered from −128 to +127 (256 levels).

There may be no direct formulas for conversion between RGB values and L*a*b*, because the RGB color model is device dependent. The RGB values first need to be transformed to CIE XYZ and then transformed to L*a*b* (as, for example, in equations (1)-(4).

$$\begin{bmatrix} X \\ Y \\ Z \end{bmatrix} = \begin{bmatrix} 0.412453 & 0.357580 & 0.180423 \\ 0.212671 & 0.715160 & 0.072169 \\ 0.019334 & 0.119193 & 0.950227 \end{bmatrix} \cdot \begin{bmatrix} R \\ G \\ B \end{bmatrix} \quad (1)$$

$$X = \frac{X}{X_n},$$

where $X_n = 0.950456$ $$Z = \frac{Z}{Z_n},$$

where $Z_n = 1.088754$ $$L = \begin{cases} 116 \times Y^{1/3} - 16 & \text{for } Y > 0.008856 \\ 903.3 \times Y & \text{for } Y \leq 0.008856 \end{cases} \quad (2)$$

$$a = 500 \times (f(X) - f(Y)) + \text{delta} \quad (3)$$

-continued $$b = 200 \times (f(Y) - f(Z)) + \text{delta} \quad (4)$$

where $$f(t) = \begin{cases} t^{1/3} & \text{for } t > 0.008856 \\ 7.787t + \dfrac{16}{116} & \text{for } t \leq 0.008856 \end{cases}$$

and $$\text{delta} = \begin{cases} 128 & \text{for 8 - bit images} \\ 0 & \text{for floating - point image} \end{cases}$$

This outputs $0 \leq L \leq 100$, $-128 \leq a \leq 127$, and $-128 \leq b \leq 127$ For 8-bit images, the values are then converted to the destination data type:

$$L = L \times 255/100 \quad (5)$$

$$a = a + 128 \quad (6)$$

$$b = b + 128 \quad (7)$$

The reference image 32 needs to be analyzed first. A reference image 32 is a comparatively clear image of the stuffing box 11 without leak. From the reference image 32, we need to get the information of the stuffing box position, ROI size and dominant color. The illumination of the reference image 32 should be good, no glares, no shading.

To detect oil leak 38, we need to detect the color change on the top of the stuffing box 11. If there is a leak, the color of the stuffing box 11 must be covered by the oil partially or totally. Thus, we first need to know the dominant color of the stuffing box 11. The dominant color of a stuffing box 11 is determined by an automatic analysis in the L*a*b* domain. As we already know, a* channel is representing red-green color, and b* channel is representing yellow-blue color. If a* is positive, the stuffing box is reddish. Otherwise, it is greenish. If b* is positive, the stuffing box is yellowish. Otherwise, it is bluish. Since there are two color channels obtained from L*a*b*, we need to select the dominant one and focus on it to analyze the color change.

In an example of an information extraction step 42 in the proposed method (FIG. 4), the dominant color is determined at step 44 by selecting the channel that has the most apparent non-neutral color (not white, black or gray). To select this channel, an image of the target is analyzed. If the target does not occupy all or a substantial portion of the field of view of the target, a mask may be applied to eliminate portions of the field of view that do not correspond to the target and thus segment the ROI. In the case of a stuffing box, for example, the shaft that passes through the stuffing box may be removed from the image by masking. In a typical field of view of a stuffing box, the top of a stuffing box will appear as an oval shape and the mask may have this oval shape, with the shaft removed. Referring back to equations (6) and (7), the values are added by factor, in this case 128, which corresponds to the neutral color, e.g., black. Whichever channel is more apparent (brighter average or summed values of the pixels) is selected and the dominant color of the stuffing box is represented by that channel. If the ROI is segmented by a mask to isolate relevant portions of the ROI, then the processing is carried out on the segmented ROI.

To determine the major channel automatically, we use the following equation, where the value 128 depends on the selection of the factor in equations (6) and (7). For each channel, get $$\text{sum1} = \Sigma(x_r - 128) \text{ where } (x_r - 128 > 5)$$

$$\text{sum2} = \Sigma((x_r - 128) \text{ where } (x_r - 128 < -5)$$

$$\text{sum} = \max(|\text{sum1}|, |\text{sum2}|)$$

$$\text{Major Channel} = \text{argmax}(\text{sum}) \quad (8)$$

$x_r$ is the reference image pixel.

Figure 5:
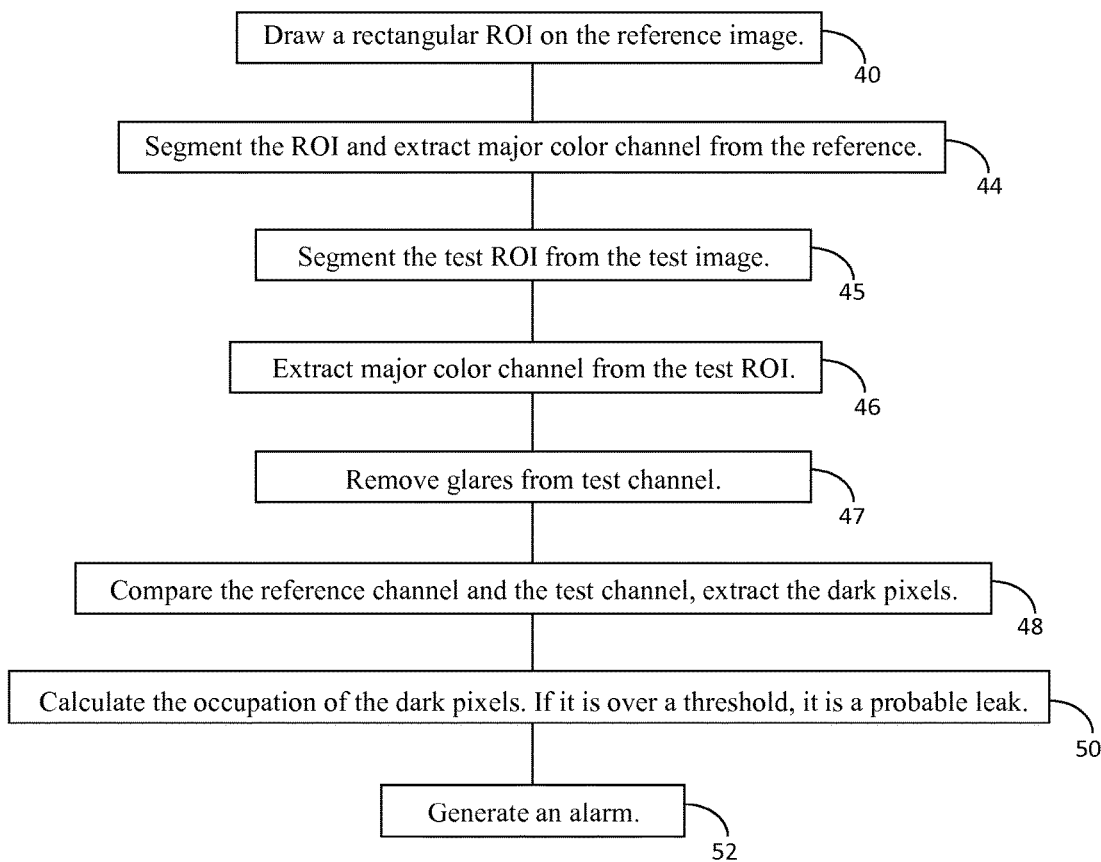
FIG. 5 illustrates exemplary method steps.

To determine the presence of a leak, a test image 34 is analyzed at step 46. The test image is segmented first by the ROI position (step 45 in FIG. 5) and size obtained from the reference image. The mask used on the reference image may be used to select a segmented part of the ROI 36 in the test image. Then only the segmented ROI 36 is analyzed. After the major channel of the testing ROI is obtained, it is compared at step 48 with the major channel of the reference ROI to determine if there is a leak. The condition that we use to determine the leak is the color change from the reference in the major channel. As mentioned before, outdoor applications are always affected by environmental factors. Sometimes, lighting can generate glares at the top of the stuffing box. Since the glares always change the box color significantly and generate similar response in the major color channel as the oil, in situations where the target may be subject to glare as for example a stuffing box in an outdoor location, we need to remove the glares from the test image first (step 47 in FIG. 5).

From our observation, even though glares have similar response as oil, they still have specific characteristics. If the stuffing box color is reddish or yellowish, the response in the major channel is bright, much brighter than the oil color which is around 128. The glares always generate the darkest values. If the stuffing box color is greenish or bluish, the response in the major channel is dark, much darker than the oil which is around 128. The glares always generate the brightest values. Using these kinds of characteristics, we can remove all the glares from the test image before testing. Since we require that the selected reference image must have no glare, we determine the glares based on the reference image. For reddish or yellowish stuffing box, the glares' response is darker than the lowest value of the reference response. If the lowest value is higher than 128, then it is darker than 128. Thus, we have the following equation.

For reddish or yellowish stuffing box, $$\text{MinVal} = \min(\min(x_r), 128) \quad (9)$$

if $(x < \text{MinVal} - 5)$ x is test image pixel then x is a glare pixel

For greenish or bluish stuffing box, the glares' response is brighter than the highest value of the reference response. If the highest value is lower than 128, then it is brighter than 128. Thus, we have the following equation.

For greenish or bluish stuffing box, $$\text{MaxVal} = \max(\max(x_r), 128) \quad (10)$$

if $(x > \text{MaxVal} + 5)$ then x is a glare pixel

The glare pixels will be excluded from the leak detection determination in this embodiment (step 47).

To determine if a pixel x is oil leak or not, we compare a test major channel with the reference major channel at step 48. When the stuffing box is reddish or yellowish, the oil's response is darker. When the stuffing box is greenish or bluish, the oil's response is brighter. Thus, we use the following conditions to evaluate (step 50).

For reddish or yellowish stuffing box, if (x<threshold+2)            (a)

&& if (x<$x_r$)              (b)

&& if (R>210&&G>210&&B>210)     (c)

then
x is potential oil leak point
Here, R, G, B are the pixel's RGB values.
Condition (a) means x is a neutral color (black, white or gray). Condition (b) measures if the pixel is darker than the reference. Condition (c) measures if the pixel is white (snow).

Similarly, for greenish or bluish stuffing box, if (x>threshold−2)           (a)

&& if (x>$x_r$)              (b)

&& if (R>210&&G>210&&B>210)     (c)

then
x is potential oil leak point
Condition (a) means x is a neutral color (black, white or gray). Condition (b) measures if the pixel is brighter than the reference. Condition (c) measures if the pixel is white (snow). In effect, snow pixels are removed from consideration in the analysis. In the above, the threshold is chosen to be 128.

Even under some bad environment, e.g., storm, rain, light change, the stuffing box can still present some color if there is no leak. If there is no color and if it is darker (reddish/yellowish base) or brighter (greenish/bluish base) than the reference, it must be some leak.

When the oil leak points occupy a certain percentage of the area of the stuffing box, an alarm is triggered (step 52). The wellhead operators will receive a message and the associated image showing the leak. The percentage we chose is 20% in one embodiment.

In our experimental testing, the dataset we used was captured from 6 different wellhead stuffing boxes, totaling 215 images. For each stuffing box, 30-40 images were used with various illumination conditions, various weather conditions and under different complex situations. Some stuffing boxes have residual oil from previous leak; some stuffing boxes have color peeled off.

Among the 215 test images, 97 have no leak and 118 have a leak. We got 4 false alarms and 3 missing leaks. The true detection rate is 96.6% and the false detection rate is 3.09%. We found that our proposed method is robust to varying outdoor environments.

This invention presents a novel image analytics based approach that can automatically detect oil wellhead stuffing box leakage and generate alarms. The approach takes advantage of the color difference between the stuffing box and oil to detect the leak. The proposed method is robust to the varying outdoor environments, such as lighting change, weather change, paint peeling, etc. The associated system is easy to install without interfering with wellhead operation. The method may also be used to test for the presence of leaks in other targeted equipment, where a surface or region of interest on the equipment is susceptible to a leak that exhibits a color change.

In the claims, the word "comprising" is used in its inclusive sense and does not exclude other elements being present. The indefinite articles "a" and "an" before a claim feature do not exclude more than one of the feature being present. Each one of the individual features described here may be used in one or more embodiments and is not, by virtue only of being described here, to be construed as essential to all embodiments as defined by the claims.

The embodiments of the invention in which an exclusive property or privilege is claimed are defined as follows:

1. A method of detecting a leak in equipment forming a target, the method comprising:
 acquiring a test image of the target with a camera, in which the test image comprises pixel values that are representative of color in a first color space;
 sending the test image to an image analyzer;
 analyzing the test image to determine if a leak is present on the equipment from the pixel values that are representative of color, by transforming the pixel values to a second color space, determining a dominant color channel of the test image as transformed into the second color space and comparing the dominant color channel of the test image as transformed to the second color space with color information from at least one reference image of the target; and
 upon determining that a leak is present, generating a notification of the presence of a leak.

2. The method of claim 1 in which the second color space has a blue-yellow axis and a red-green axis.

3. The method of claim 1 in which the presence of a leak is determined by the following protocol: the target is relatively dark when dominantly red or yellow or the target is relatively bright when dominantly green or blue.

4. The method of claim 1 in which analyzing is carried out by analysis of a region of interest in the test image.

5. The method of claim 1 in which analyzing is carried out by analysis of a segmented portion of a region of interest in the test image.

6. The method of claim 4 in which the region of interest is user selected.

7. The method of claim 1 in which analyzing comprises removing pixel values representative of glare from the test image.

8. The method of claim 1 in which analyzing comprises removing pixel values representative of snow from analysis of the test image.

9. An image analysis system comprising a camera and a server with an input port and an output port, the server being configured to carry out the method steps of claim 1.

10. Apparatus for detecting a leak in equipment forming a target, the apparatus comprising:
 an image analyzer configured to receive an image from a camera, the image comprising pixel values that are representative of color in a first color space, and to analyze the image to determine if a leak on the equipment is present by transforming the pixel values to a second color space, determining a dominant color channel of the test image as transformed into the second color space and comparing the dominant color channel of the image as transformed to the second color space with color information from a reference image of the target and the image analyzer having an output port for delivering a notification upon the image analyzer determining that a leak is present on the equipment.

11. The apparatus of claim 10 further comprising a camera connected to send an image of the target to the image analyzer.

12. The apparatus of claim 10 in which the second color space has a blue-yellow axis and a red-green axis.

13. A method of detecting a liquid leak in a stuffing box, the method comprising:

acquiring a test image of the stuffing box with a camera, in which the test image comprises pixel values that are representative of color in a first color space;

sending the test image to an image analyzer;

transforming the pixel values to a second color space;

determining a dominant color channel of the test image as transformed into the second color space;

analyzing the test image to determine if a liquid leak is present on the stuffing box from pixel values of the transformed pixel values that are representative of the dominant color as transformed to the second color space; and upon determining that a liquid leak is present, generating a notification of the presence of the leak.

14. The method of claim 13 in which analyzing the test image comprises comparing the dominant color channel of the test image with a reference.

15. The method of claim 14 in which the reference comprises color information from a reference image of the stuffing box.

16. The method of claim 13 in which the second color space has a blue-yellow axis and a red-green axis.

\* \* \* \* \*